United States Patent
Yan et al.

(10) Patent No.: US 10,964,790 B1
(45) Date of Patent: Mar. 30, 2021

(54) TFT SUBSTRATE AND MANUFACTURING METHOD THEREOF

(71) Applicant: Wuhan China Star Optoelectronics Technology Co., Ltd., Wuhan (CN)

(72) Inventors: Yuan Yan, Wuhan (CN); Lisheng Li, Wuhan (CN); Dewei Song, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 405 days.

(21) Appl. No.: 16/097,838

(22) PCT Filed: Sep. 14, 2018

(86) PCT No.: PCT/CN2018/105626
§ 371 (c)(1),
(2) Date: Oct. 31, 2018

(87) PCT Pub. No.: WO2019/205440
PCT Pub. Date: Oct. 31, 2019

(30) Foreign Application Priority Data

Apr. 27, 2018 (CN) .................. 201810390114.X

(51) Int. Cl.
*H01L 29/417* (2006.01)
*H01L 29/66* (2006.01)
(Continued)

(52) U.S. Cl.
CPC ...... *H01L 29/41733* (2013.01); *H01L 27/124* (2013.01); *H01L 27/1288* (2013.01);
(Continued)

(58) Field of Classification Search
CPC . H01L 29/78618–78627; H01L 29/458; H01L 27/124; H01L 21/043;
(Continued)

(56) References Cited

U.S. PATENT DOCUMENTS 10,014,172 B2    7/2018  Ahn

FOREIGN PATENT DOCUMENTS

| CN | 101656270 A | 2/2010 |
| CN | 104051652 A | 9/2014 |

(Continued)

*Primary Examiner* — Amar Movva
(74) *Attorney, Agent, or Firm* — Leong C. Lei

(57) ABSTRACT

The present invention teaches a TFT substrate manufacturing method and a TFT substrate. The method configures contact region vias in the source/drain contact regions at two ends of the active layer, provides buffer layer troughs in the buffer layer beneath the contact region vias, and forms undercut structure between the buffer layer troughs and the active layer around the contact region vias, thereby separating the transparent conductive layer at the contact region vias, and extending the source/drain electrodes to contact the source/drain contact regions of the active layer from below through the buffer layer troughs. The present invention therefore prevents the occurrence of Schottky contact barrier resulted from the contact between poly-Si and ITO in the 7-mask process by letting the source/drain electrodes to directly contact and form ohmic contact with the source/drain contact regions of the active layer, thereby enhancing the electronic mobility of TFT devices.

10 Claims, 7 Drawing Sheets

(51) Int. Cl.
*H01L 29/786* (2006.01)
*H01L 27/12* (2006.01)
*H01L 29/45* (2006.01)
*H01L 21/311* (2006.01)

(52) U.S. Cl.
CPC .. *H01L 29/66757* (2013.01); *H01L 29/78618* (2013.01); *H01L 21/31116* (2013.01); *H01L 29/458* (2013.01); *H01L 29/78633* (2013.01)

(58) Field of Classification Search
CPC ......... H01L 21/0485; H01L 29/45–458; H01L 51/105; H01L 33/12; H01L 21/3115; H01L 21/32
See application file for complete search history.

(56) References Cited

FOREIGN PATENT DOCUMENTS

| | | |
|---|---|---|
| CN | 105514116 A | 4/2016 |
| CN | 105679775 A | 6/2016 |
| KR | 20110066640 A | 6/2011 |

# TFT SUBSTRATE AND MANUFACTURING METHOD THEREOF

FIELD OF THE INVENTION

The present invention is generally related to the field of display technology, and more particularly to a thin film transistor (TFT) substrate and its manufacturing method.

BACKGROUND OF THE INVENTION

In the field of display technologies, liquid crystal display (LCD) and active matrix organic light emitting diode (AMOLED) are widely applied to mobile phones, personal digital assistants (PDA), digital cameras, computer screens, and notebook screens, due to their thin thickness, high quality, power saving, and low radiation.

Thin film transistor (TFT) array substrate is a key component to LCD and AMOLED devices, directly affecting the performance of these flat panel display devices. For the provision of driving circuit to the display devices, the TFT array substrate is usually configured with multiple gate scan lines and multiple data lines, jointly defining multiple pixel units. Each pixel unit is configured with TFT and pixel electrode. The gate of the TFT is connected to a corresponding gate scan line. When the voltage on the gate scan line reaches the threshold voltage, the source and drain of the TFT are conducted, and the voltage on the data line reaches the pixel electrode, thereby controlling the display of the corresponding pixel. Usually the TFT on the array substrate includes gate electrode, gate insulation layer, active layer, source and drain electrodes, and insulating protection layer, stacked on the substrate.

Compared to traditional amorphous silicon (a-Si) TFT, low temperature poly-silicon (LTPS) TFT, due to better carrier mobility, is widely applied to small- to medium-sized, high-resolution, LCD and AMOLED display panels, despite its more complex manufacturing process. LTPS is considered as an important material to achieve low-cost and full-color flat panel displays.

As LCD and AMOLED display panels are driven for even smaller dimensions, the mask processes have to be more complex and therefore lead to significant production cost increase. Take the popular touch panel as example. In order to achieve both display and touch control, a common approach, In Cell Touch, is to integrate a layer with touch control function in the original array process. As each layer requires mask and etching to form a specific pattern, an array substrate for an In Cell Touch panel usually requires 12 masks, significantly increasing the workload of exposure machines, complicating the array process, and reducing the productivity of the array substrate. To lower the production cost, the industry has already developed a process requiring only 9 masks. This improvement however still cannot keep up with the ever increasing product demands.

Based on the 9-mask technique, a 7-mask process for In Cell Touch LTPS array substrate is achieved by sharing a mask for both the interlayer dielectric (ILD) layer and the planarization (PLN) layer, and sharing another half tone mask (HTM) for the source/drain (SD) electrodes, touch lines, and pixel electrodes after switching the locations of the common electrode layer (BITO) and the pixel electrode layer (TITO). However, after sharing a mask for the source/drain electrodes and the pixel electrodes in the 7-mask process, source/drain electrodes would only indirectly contact the source/drain contact regions of the active layer through indium tin oxide (ITO). Schottky contact barrier, and therefore current limiting effect, would occur as poly-silicon (poly-Si) contacts ITO, causing significant drop in TFT device mobility.

SUMMARY OF THE INVENTION

An objective of the present invention is to provide a TFT substrate manufacturing method capable of preventing the occurrence of Schottky contact barrier resulted from the contact between poly-Si and ITO in the 7-mask process by letting the source/drain electrodes to directly contact and form ohmic contact with the source/drain contact regions of the active layer, thereby enhancing the electronic mobility of TFT devices.

Another objective of the present invention is to provide a TFT substrate capable of preventing the occurrence of Schottky contact barrier resulted from the contact between poly-Si and ITO in the 7-mask process by letting the source/drain electrodes to directly contact and form ohmic contact with the source/drain contact regions of the active layer, thereby enhancing the electronic mobility of TFT devices.

To achieve the objectives, the present invention provides a TFT substrate manufacturing method including the following steps:

step S1: providing a substrate, and sequentially forming a buffer layer, an active layer, a gate insulation layer, an interlayer dielectric (ILD) layer, and a planarization (PLN) layer from bottom to top on the substrate, where the active layer comprises source/drain contact regions at two ends, each having a contact region via, and a ditch region in the center of the active layer;

step S2: conducting exposure and development to the PLN layer to form photoresist vias on the PLN layer above the contact region vias, performing a first etching to the ILD layer, the gate insulation layer, and the buffer layer using the PLN layer as a shielding layer to form insulation layer vias connecting the contact region vias on the ILD layer and the gate insulation layer, and forming buffer layer troughs connecting the contact region vias on the buffer layer;

step S3: conducting a second etching to the buffer layer to laterally widen the buffer layer troughs, where an undercut structure is formed between the buffer layer troughs and the active layer around the contact region vias; and step S4: sequentially forming a transparent conductive layer and a metallic layer on the ILD layer by deposition, where the transparent conductive layer is separated by the contact region vias, and the metallic layer is continuously extended into and fills up the buffer layer troughs, and patterning the transparent conductive layer and the metallic layer to form the source/drain electrodes and touch line from the metallic layer, and the pixel electrodes from the transparent conductive layer, where the source/drain electrodes contact the source/drain contact regions of the active layer from below through the buffer layer troughs.

The TFT substrate manufacturing method may include a step S5: forming a passivation layer on the ILD layer covering the transparent conductive layer and the metallic layer, and forming a common electrode layer on the passivation layer by deposition and patterning.

The transparent conductive layer is made of indium tin oxide (ITO).

The buffer layer is a combination of a silicon oxide (SiOx) layer and a silicon nitride (SiNx) layer. The SiOx layer is stacked on the SiNx layer. The buffer layer troughs formed in step S2 is in the SiOx layer.

The SiOx layer in the buffer layer has a refractive index between 1.40 and 1.47.

Step S2 conducts the first etching to the ILD layer, the gate insulation layer, and the buffer layer using dry etching with an etching gas containing carbon tetrafluoride ($CF_4$).

Step S3 conducts the second etching to the buffer layer using dry etching with an etching gas containing pentafluoroethane ($C_2HF_5$).

The step S4 includes the following steps:

step S41: sequentially forming the transparent conductive layer and the metallic layer by deposition, coating a photoresist layer on the metallic layer, and obtaining a photoresist pattern by exposing the photoresist layer using the HTM mask and developing the photoresist layer;

step S42: conducting a first etching to the transparent conductive layer and the metallic layer using the photoresist pattern as a shielding layer to obtain stacked transparent conductive pattern and metallic pattern, where the metallic pattern includes a target metallic pattern and a to-be-removed metallic pattern, the transparent conductive pattern includes a reserved conductive pattern and a target conductive pattern, beneath and corresponding to the target metallic pattern and the to-be-removed metallic pattern, respectively, the target metallic pattern includes source/drain electrodes and touch line, and the target conductive pattern includes pixel electrode; and step 43: removing the photoresist pattern above the to-be-removed metallic pattern using an ashing process, conducting a second etching to the metallic layer to remove the to-be-removed metallic pattern and to expose the target conductive pattern.

The present invention also teaches a TFT substrate, including a substrate, a buffer layer on the substrate, an active layer on the buffer layer, a gate insulation layer on the buffer layer covering the active layer, a gate electrode on the gate insulation layer, an ILD layer on the gate insulation layer covering the gate electrode, a transparent conductive layer on the ILD layer, a metallic layer on the transparent conductive layer, wherein the active layer comprises source/drain contact regions at two ends, each having a contact region via, and a ditch region in the center of the active layer;

insulation layer vias are configured in the ILD layer and the gate insulation layer connecting the contact region vias, and buffer layer troughs are configured on the buffer layer connecting the contact region vias; and the transparent conductive layer is separated by the contact region vias, the metallic layer is continuously extended into and fills up the buffer layer troughs, the metallic layer comprises source/drain electrodes and touch line, the source/drain electrodes contact the source/drain contact regions of the active layer from below through the buffer layer troughs.

The TFT substrate further includes a shading layer between the substrate and the buffer layer, a passivation layer on the ILD layer covering the transparent conductive layer and the metallic layer, and a common electrode layer on the passivation layer, wherein the transparent conductive layer is made of ITO; and the active layer is a low temperature poly-silicon (LTPS) layer.

The advantages of the present invention is as follows. The TFT substrate manufacturing method of the present invention configures contact region vias in the source/drain contact regions at two ends of the active layer, provides buffer layer troughs in the buffer layer beneath the contact region vias, and forms undercut structure between the buffer layer troughs and the active layer around the contact region vias, thereby separating the transparent conductive layer at the contact region vias, and extending the source/drain electrodes through the insulation layer vias and the contact region vias to contact the source/drain contact regions of the active layer from below through the buffer layer troughs. The present invention therefore prevents the occurrence of Schottky contact barrier resulted from the contact between poly-Si and ITO in the 7-mask process by letting the source/drain electrodes to directly contact and form ohmic contact with the source/drain contact regions of the active layer, thereby enhancing the electronic mobility of TFT devices. The TFT substrate of the present invention have contact region vias in the source/drain contact regions at two ends of the active layer, and buffer layer troughs in the buffer layer beneath the contact region vias. Undercut structure is formed between the buffer layer troughs and the active layer around the contact region vias. The transparent conductive layer is therefore separated at the contact region vias, and the source/drain electrodes are extended through the insulation layer vias and the contact region vias to contact the source/drain contact regions of the active layer from below through the buffer layer troughs. The present invention therefore prevents the occurrence of Schottky contact barrier resulted from the contact between poly-Si and ITO in the 7-mask process by letting the source/drain electrodes to directly contact and form ohmic contact with the source/drain contact regions of the active layer, thereby enhancing the electronic mobility of TFT devices

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
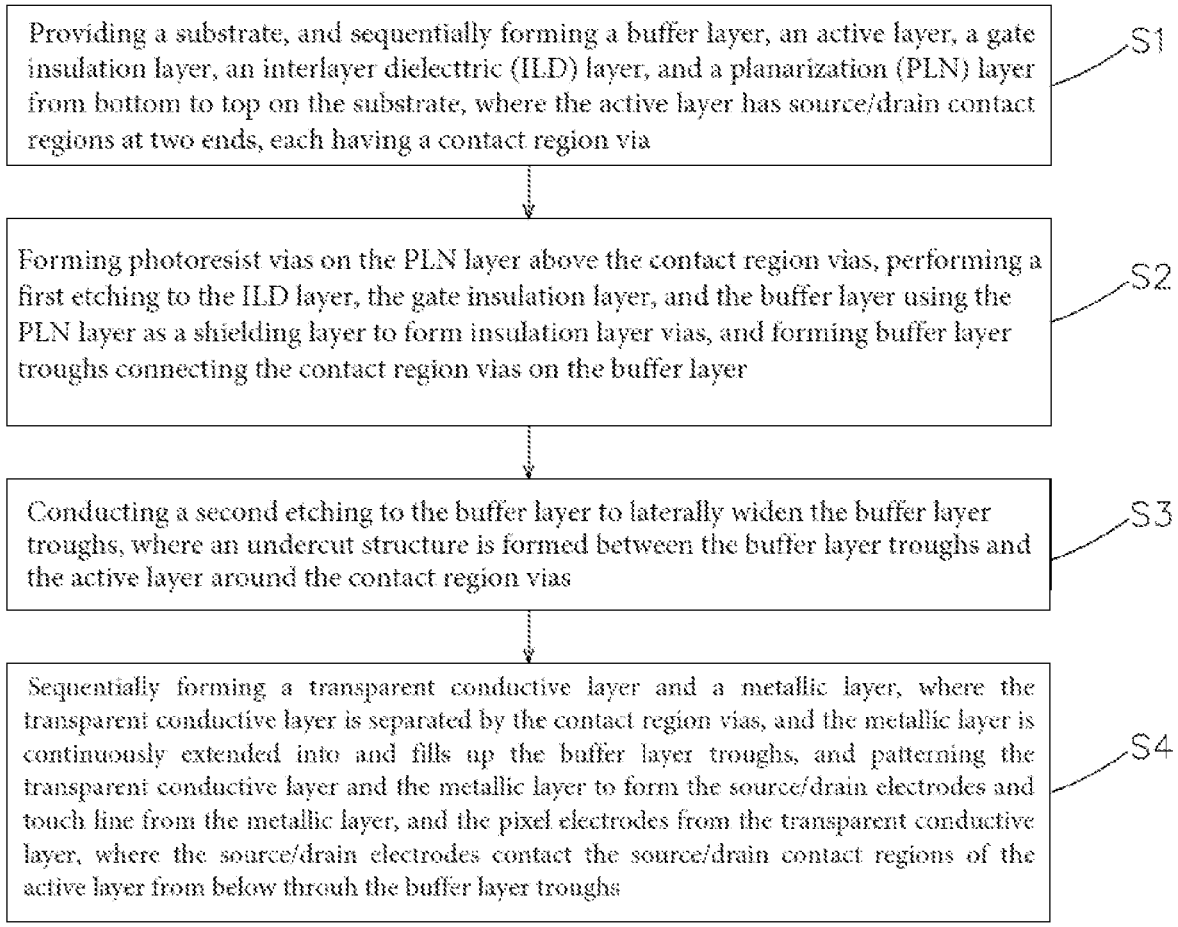
FIG. 1 is a flow diagram showing a TFT substrate manufacturing method according to an embodiment of the present invention.

As shown in FIG. 1, a TFT substrate manufacturing method according to an embodiment of the present invention includes the following steps.

Figure 2:
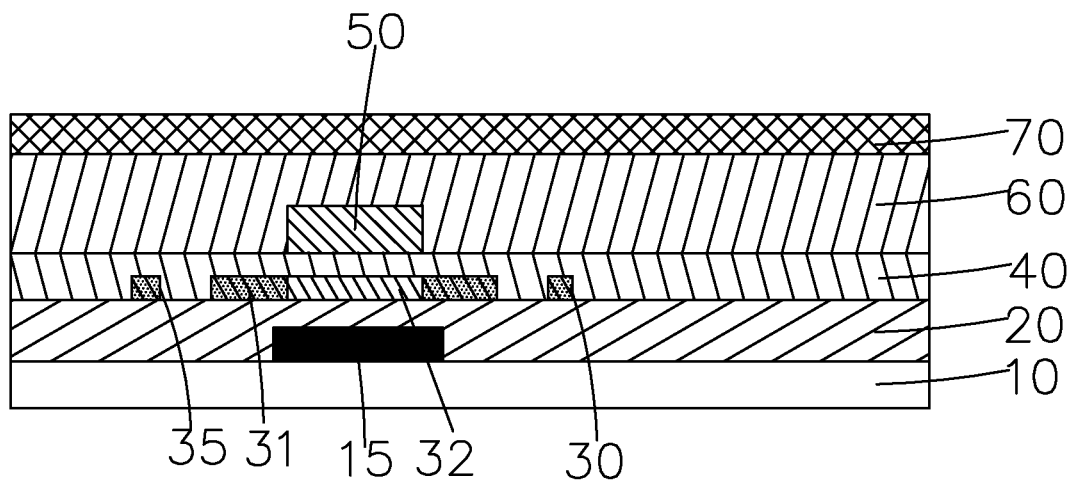
FIG. 2 is a schematic diagram showing the manufacturing of a TFT substrate in a step S1 of the method of FIG. 1.

Step S1, as shown in FIG. 2, provides a substrate 10, and sequentially forms a shading layer 15 on the substrate 10, a buffer layer 20 on the substrate 10 covering the shading layer 15, an active layer 30 on the buffer layer 20, a gate insulation layer 40 on the buffer layer 20 covering the active layer 30, a gate electrode 50 on the gate insulation layer 40, an interlayer dielectric (ILD) layer 60 on the gate insulation layer 40 covering the gate electrode 50, and a planarization (PLN) layer 70 on the ILD layer 60.

Figure 3:
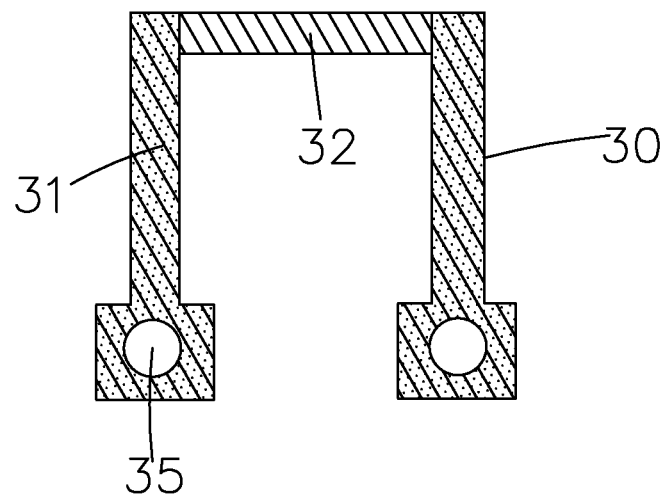
FIG. 3 is a planar diagram showing an active layer formed in a step S1 of the method of FIG. 1.
Figure 4:
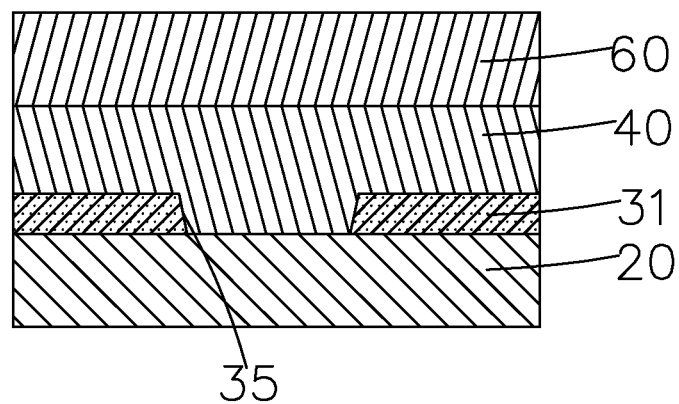
FIG. 4 is a schematic diagram showing the structure around a contact region via in a step S1 of the method of FIG. 1.

Specifically, as shown in FIGS. 3 and 4, the active layer 30 includes source/drain contact regions 31 at two ends, and a ditch region 32 between the source/drain contact region 31. Each source/drain contact region 31 has a contact region via 35.

Specifically, the buffer layer 20 is a combination of at least a silicon oxide (SiOx) layer and at least a silicon nitride (SiNx) layer. The SiOx layer is stacked on the SiNx layer.

Specifically, the gate insulation layer 40 is a SiOx layer. The ILD layer 60 is a combination of at least a SiOx layer and at least a SiNx layer.

Specifically, the active layer 30 is a low temperature poly-silicon (LTPS) layer.

Figure 5:
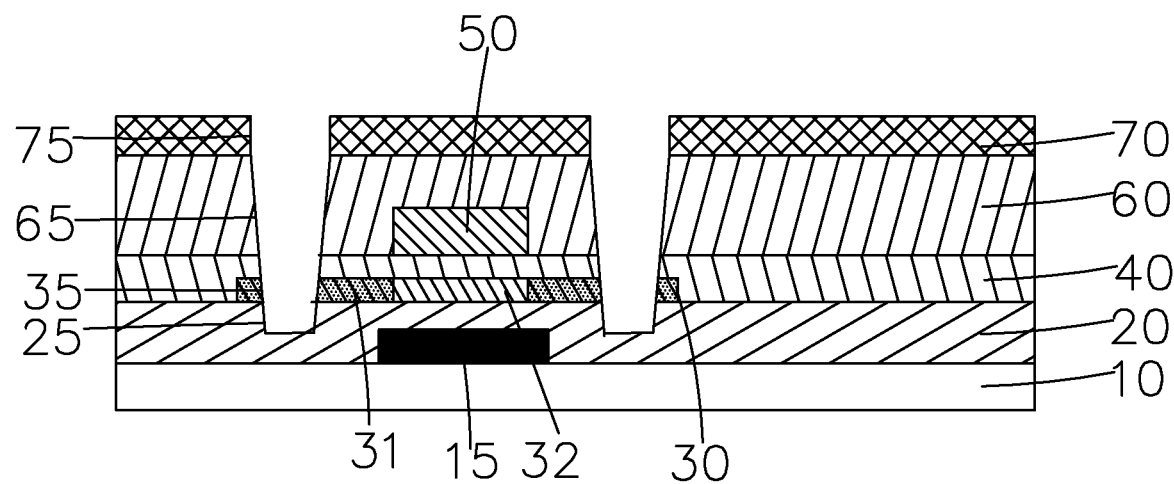
FIG. 5 is a schematic diagram showing the manufacturing of a TFT substrate in a step S2 of the method of FIG. 1.
Figure 6:
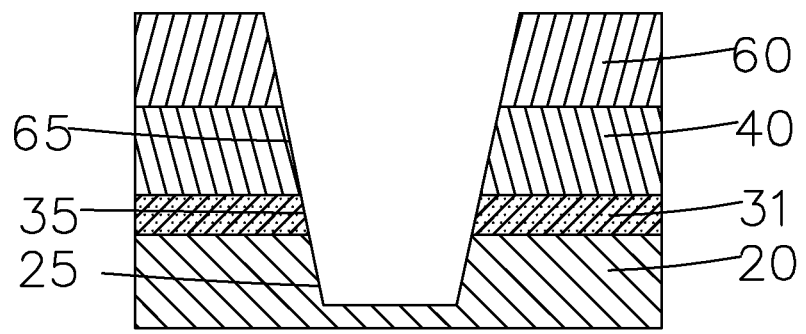
FIG. 6 is a schematic diagram showing the structure around a contact region via in a step S2 of the method of FIG. 1.

Step S2, as shown in FIG. 5, conducts exposure and development to the PLN layer 70 to form photoresist vias 75 on the PLN layer 70 above the contact region vias 35. Step S2 then performs a first etching, as shown in FIG. 6, to the ILD layer 60, the gate insulation layer 40, and the buffer layer 20, using the PLN layer 70 as a shielding layer to form insulation layer vias 65 connecting the contact region vias 35 and the photoresist vias 75 on the ILD layer 60 and the gate insulation layer 40, and to form buffer layer troughs 25 connecting the contact region vias 35 on the buffer layer 20 beneath the contact region vias 35.

Specifically, Step S2 conducts the first etching to the ILD layer 60, the gate insulation layer 40, and the buffer layer 20 using dry etching with an etching gas containing carbon tetrafluoride ($CF_4$).

Specifically, the buffer layer troughs 25 formed in step S2 is within the SiOx layer of the buffer layer 20.

Figure 7:
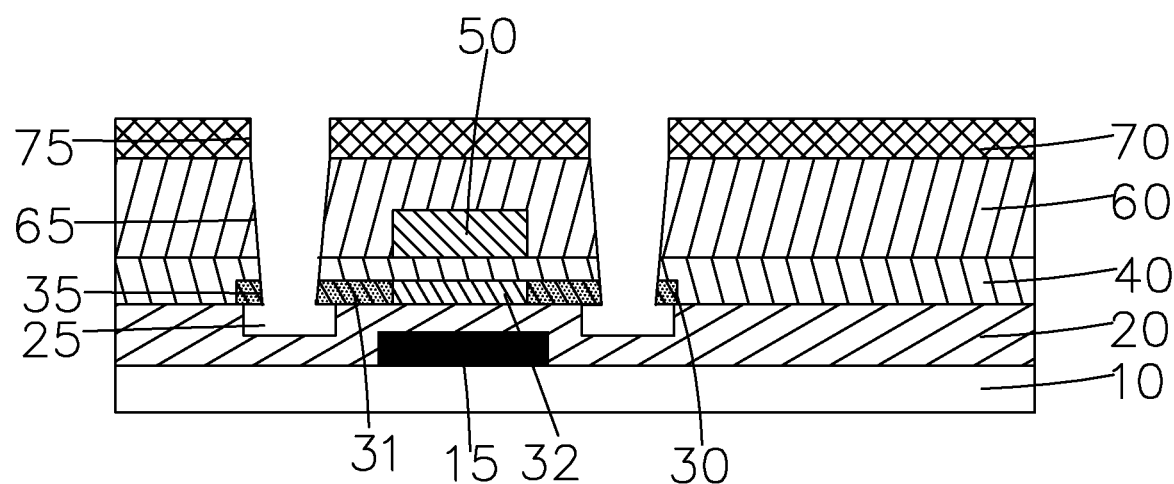
FIG. 7 is a schematic diagram showing the manufacturing of a TFT substrate in a step S3 of the method of FIG. 1.
Figure 8:
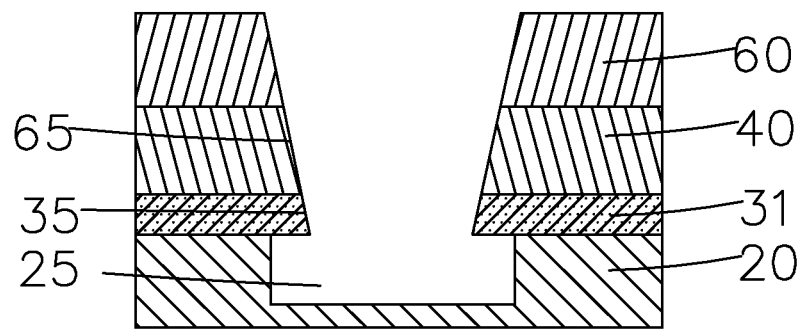
FIG. 8 is a schematic diagram showing the structure around a contact region via in a step S3 of the method of FIG. 1.

Step S3, as shown in FIG. 7, conducts a second etching to the buffer layer 20 to laterally widen the buffer layer troughs 25. As shown in FIG. 8, Specifically, step S3 conducts the second etching to the buffer layer 20 using dry etching.

Specifically, the SiOx layer in the buffer layer 20 formed in step S1 has a loose structure with a refractive index 1.40-1.47. Normally structured SiOx layer usually has a refractive index greater than 1.49. For example, the ILD layer 60 is a SiOx layer. On the other hand, the etching gas used for the second etching in step S3 has etch selectivity towards the buffer layer 20. The etching gas contains pentafluoroethane ($C_2HF_5$) so that the buffer layer 20 may be laterally etched around the buffer layer troughs 25, thereby forming the undercut structure between the buffer layer troughs 25 and the active layer 30.

Figure 9:
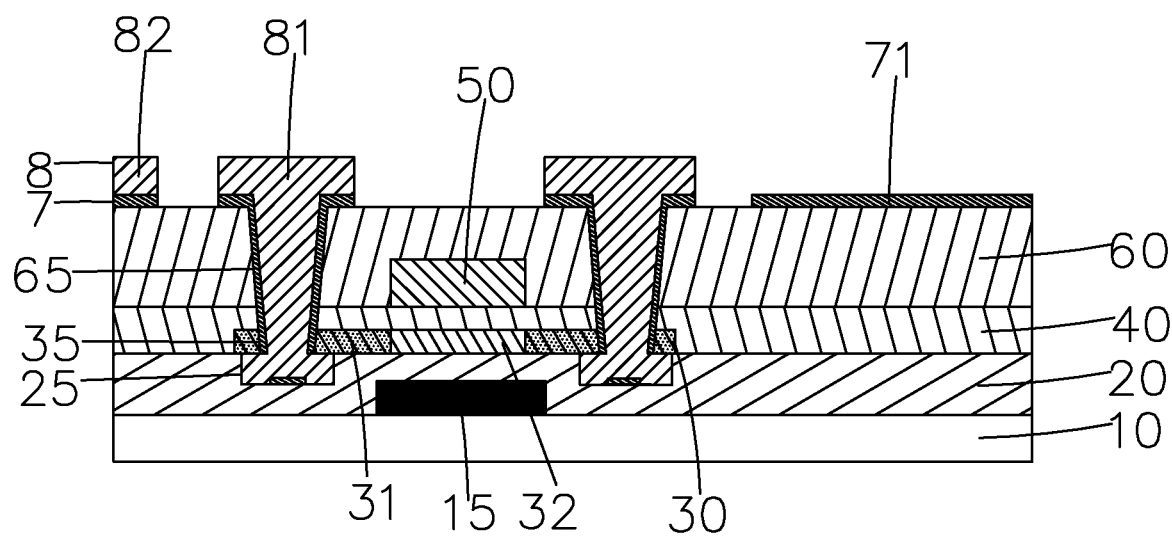
FIG. 9 is a schematic diagram showing the manufacturing of a TFT substrate in a step S4 of the method of FIG. 1.
Figure 10:
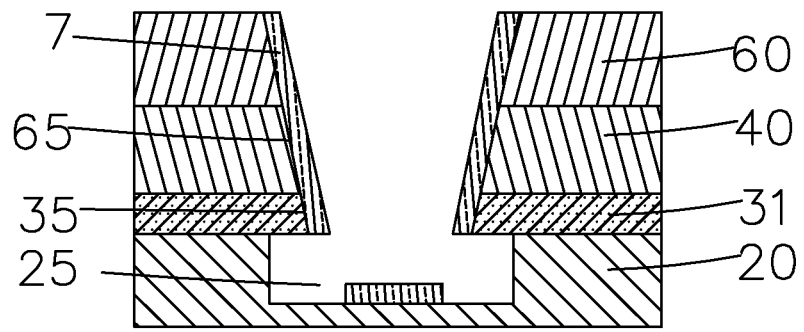
FIG. 10 is a schematic diagram showing a transparent conductive layer being separated by a contact region via in a step S4 of the method of FIG. 1.
Figure 11:
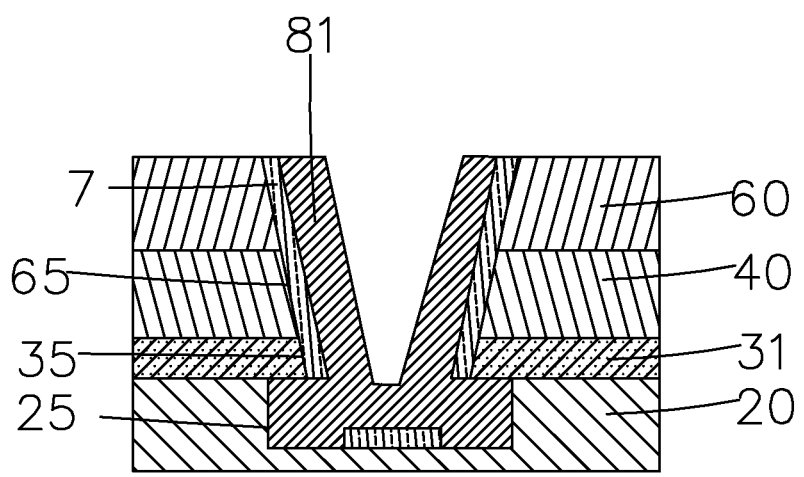
FIG. 11 is a schematic diagram showing a source/drain electrode contacting an active layer from below within a buffer layer trough in a step S4 of the method of FIG. 1.

Step S4, as shown in FIG. 9, sequentially forms a transparent conductive layer 7 and a metallic layer 8 on the ILD layer 60 by deposition. As shown in FIG. 10, the transparent conductive layer 7 is separated by the contact region vias 35, and the metallic layer 8 is continuously extended into and fills up the buffer layer troughs 25. Then, the transparent conductive layer 7 and the metallic layer 8 are patterned to form the source/drain electrodes 81 and touch line 82 from the metallic layer 8, the pixel electrodes 71 from the transparent conductive layer 7. As shown in FIG. 11, the source/drain electrode 81 contacts the source/drain contact regions 31 of the active layer 30 from below through the buffer layer trough 25.

Specifically, the transparent conductive layer 7 is made of indium tin oxide (ITO).

It should be noted that 2 masks are required for the ILD layer 60 and the PLN layer 70 in the 9-mask process. However, the 7-mask process of the present invention uses the PLN layer 70 as a photoresist layer for the ILD layer 60. Then, after the ILD layer 60 is patterned in step S3, and before the transparent conductive layer 7 and the metallic layer 8 are formed by deposition in step S4, the PLN layer 70 is peeled. Therefore, a single mask may achieve the formation of the ILD layer 60, and a mask process is omitted relative to the 9-maks process. The transparent conductive layer 7 and the metallic layer 8 are formed on the ILD layer 60.

Alternatively, step S4 may also keep the PLN layer 70, and form the transparent conductive layer 7 and the metallic layer 8 on the PLN layer 70.

Specifically, step S4 patterns the transparent conductive layer 7 and the metallic layer 8 using a HTM by the following steps.

Step S41 sequentially forms the transparent conductive layer 7 and the metallic layer 8 by deposition, coats a photoresist layer on the metallic layer 8, and obtains a photoresist pattern by exposing the photoresist layer using the HTM mask and developing the photoresist layer.

Step S42 conducts a first etching to the transparent conductive layer 7 and the metallic layer 8 using the photoresist pattern as a shielding layer to obtain stacked transparent conductive pattern and metallic pattern. The metallic pattern includes a target metallic pattern and a to-be-removed metallic pattern. The transparent conductive pattern includes a reserved conductive pattern and a target conductive pattern, beneath and corresponding to the target metallic pattern and the to-be-removed metallic pattern, respectively. The target metallic pattern includes source/drain electrodes 81 and touch line 82. The target conductive pattern includes pixel electrode 71. The photoresist pattern has a smaller thickness above the to-be-remove metallic pattern than that above the target metallic pattern.

Step 43 removes the photoresist pattern above the to-be-removed metallic pattern using an ashing process, conducts a second etching to the metallic layer 8 to remove the to-be-removed metallic pattern and to expose the target conductive pattern.

Figure 12:
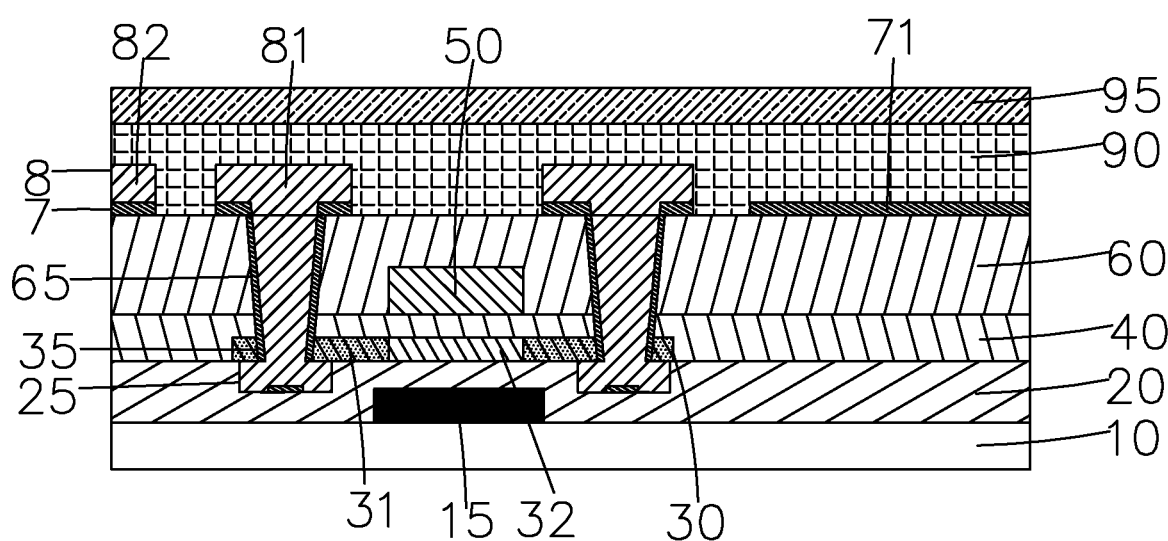
FIG. 12 is a schematic diagram showing the manufacturing of a TFT substrate in a step S5 of the method of FIG. 1, and also is a structural schematic diagram showing the TFT substrate of the present invention.

Step S5, as shown in FIG. 12, forms a passivation layer 90 on the ILD layer 60 covering the transparent conductive layer 7 and the metallic layer 8, and forms a common electrode layer 95 by deposition and patterning.

An objective of the present invention is to provide a TFT substrate manufacturing method capable of preventing the occurrence of Schottky contact barrier resulted from the contact between poly-Si and ITO in the 7-mask process by letting the source/drain electrodes to directly contact and form ohmic contact with the source/drain contact regions of the active layer, thereby enhancing the electronic mobility of TFT devices.

Based on the above TFT substrate manufacturing method, the present invention also teaches a TFT substrate, including a substrate 10, a shading layer 15 on the substrate 10, a buffer layer 20 on the substrate 10 covering the shading layer 15, an active layer 30 on the buffer layer 20, a gate insulation layer 40 on the buffer layer 20 covering the active layer 30, a gate electrode 50 on the gate insulation layer 40, an ILD layer 60 on the gate insulation layer 40 covering the gate electrode 50, a transparent conductive layer 7 on the ILD layer 60, a metallic layer 8 on the transparent conductive layer 7, a passivation layer 90 covering the transparent conductive layer 7 and the metallic layer 8, and a common electrode layer 95 on the passivation layer 90.

The active layer 30 includes source/drain contact regions 31 at two ends, and a ditch region 32 in the center of the active layer 30. Each source/drain contact region 31 has a contact region via 35.

Insulation layer vias 65 are configured in the ILD layer and the gate insulation layer 40 connecting the contact region vias 35. Buffer layer troughs 25 are configured on the buffer layer 20 connecting the contact region vias 25.

The transparent conductive layer 7 is separated at contact region vias 35. The transparent conductive layer 7 includes pixel electrode 71. The metallic layer 8 continuously extends into and fills the buffer layer troughs 25. The metallic layer 8 includes source/drain electrodes 81 and touch line 81. The source/drain electrodes 81 contact from below the source/drain contact regions 31 of the active layer 30 through the buffer layer troughs 25.

Specifically, the transparent conductive layer 7 is made of indium tin oxide (ITO).

Specifically, the active layer 30 is a low temperature poly-silicon (LTPS) layer.

The TFT substrate of the present invention have contact region vias in the source/drain contact regions at two ends of the active layer, and buffer layer troughs in the buffer layer beneath the contact region vias. Undercut structure is formed between the buffer layer troughs and the active layer around the contact region vias. The transparent conductive layer is therefore separated at the contact region vias, and the source/drain electrodes are extended through the insulation layer vias and the contact region vias to contact the source/drain contact regions of the active layer from below through the buffer layer troughs. The present invention therefore prevents the occurrence of Schottky contact barrier resulted from the contact between poly-Si and ITO in the 7-mask process by letting the source/drain electrodes to directly contact and form ohmic contact with the source/drain contact regions of the active layer, thereby enhancing the electronic mobility of TFT devices.

As described above, the TFT substrate manufacturing method of the present invention configures contact region vias in the source/drain contact regions at two ends of the active layer, provides buffer layer troughs in the buffer layer beneath the contact region vias, and forms undercut structure between the buffer layer troughs and the active layer around the contact region vias, thereby separating the transparent conductive layer at the contact region vias, and extending the source/drain electrodes through the insulation layer vias and the contact region vias to contact the source/drain contact regions of the active layer from below through the buffer layer troughs. The present invention therefore prevents the occurrence of Schottky contact barrier resulted from the contact between poly-Si and ITO in the 7-mask process by letting the source/drain electrodes to directly contact and form ohmic contact with the source/drain contact regions of the active layer, thereby enhancing the electronic mobility of TFT devices. The TFT substrate of the present invention have contact region vias in the source/drain contact regions at two ends of the active layer, and buffer layer troughs in the buffer layer beneath the contact region vias. Undercut structure is formed between the buffer layer troughs and the active layer around the contact region vias. The transparent conductive layer is therefore separated at the contact region vias, and the source/drain electrodes are extended through the insulation layer vias and the contact region vias to contact the source/drain contact regions of the active layer from below through the buffer layer troughs. The present invention therefore prevents the occurrence of Schottky contact barrier resulted from the contact between poly-Si and ITO in the 7-mask process by letting the source/drain electrodes to directly contact and form ohmic contact with the source/drain contact regions of the active layer, thereby enhancing the electronic mobility of TFT devices.

Above are embodiments of the present invention, which does not limit the scope of the present invention. Any equivalent amendments within the spirit and principles of the embodiment described above should be covered by the protected scope of the invention.

What is claimed is:

1. A TFT substrate manufacturing method, comprising
   step S1: providing a substrate, and sequentially forming a buffer layer, an active layer, a gate insulation layer, an interlayer dielectric (ILD) layer, and a planarization (PLN) layer from bottom to top on the substrate, where the active layer comprises source/drain contact regions at two ends, each having a contact region via, and a ditch region in the center of the active layer;
   step S2: conducting exposure and development to the PLN layer to form photoresist vias on the PLN layer above the contact region vias, performing a first etching to the ILD layer, the gate insulation layer, and the buffer layer using the PLN layer as a shielding layer to form insulation layer vias connecting the contact region vias on the ILD layer and the gate insulation layer, and forming buffer layer troughs connecting the contact region vias on the buffer layer;
   step S3: conducting a second etching to the buffer layer to laterally widen the buffer layer troughs, where an undercut structure is formed between the buffer layer troughs and the active layer around the contact region vias; and
   step S4: sequentially forming a transparent conductive layer and a metallic layer on the ILD layer by deposition, where the transparent conductive layer is separated by the contact region vias, and the metallic layer is continuously extended into and fills up the buffer layer troughs, and patterning the transparent conductive layer and the metallic layer to form the source/drain electrodes and touch line from the metallic layer, and the pixel electrodes from the transparent conductive layer, where the source/drain electrodes contact the source/drain contact regions of the active layer from below through the buffer layer troughs.

2. The TFT substrate manufacturing method according to claim 1, further comprising step S5: forming a passivation layer on the ILD layer covering the transparent conductive layer and the metallic layer, and forming a common electrode layer on the passivation layer by deposition and patterning.

3. The TFT substrate manufacturing method according to claim 1, wherein the transparent conductive layer is made of indium tin oxide (ITO);
the active layer is a low temperature poly-silicon (LTPS) layer; and
step S1 forms a shading layer on the substrate before forming the buffer layer.

4. The TFT substrate manufacturing method according to claim 1, wherein the buffer layer is a combination of a silicon oxide (SiOx) layer and a silicon nitride (SiNx) layer; the SiOx layer is stacked on the SiNx layer; and the buffer layer troughs formed in step S2 is in the SiOx layer.

5. The TFT substrate manufacturing method according to claim 4, wherein the SiOx layer in the buffer layer has a refractive index between 1.40 and 1.47.

6. The TFT substrate manufacturing method according to claim 1, wherein step S2 conducts the first etching to the ILD layer, the gate insulation layer, and the buffer layer using dry etching with an etching gas containing carbon tetrafluoride ($CF_4$).

7. The TFT substrate manufacturing method according to claim 1, wherein step S3 conducts the second etching to the buffer layer using dry etching with an etching gas containing pentafluoroethane ($C_2HF_5$).

8. The TFT substrate manufacturing method according to claim 1, wherein step S4 comprises:
step S41: sequentially forming the transparent conductive layer and the metallic layer by deposition, coating a photoresist layer on the metallic layer, and obtaining a photoresist pattern by exposing the photoresist layer using the HTM mask and developing the photoresist layer;
step S42: conducting a first etching to the transparent conductive layer and the metallic layer using the photoresist pattern as a shielding layer to obtain stacked transparent conductive pattern and metallic pattern, where the metallic pattern includes a target metallic pattern and a to-be-removed metallic pattern, the transparent conductive pattern includes a reserved conductive pattern and a target conductive pattern, beneath and corresponding to the target metallic pattern and the to-be-removed metallic pattern, respectively, the target metallic pattern includes source/drain electrodes and touch line, and the target conductive pattern includes pixel electrode; and
step S43: removing the photoresist pattern above the to-be-removed metallic pattern using an ashing process, conducting a second etching to the metallic layer to remove the to-be-removed metallic pattern and to expose the target conductive pattern.

9. The TFT substrate, comprising a substrate, a buffer layer on the substrate, an active layer on the buffer layer, a gate insulation layer on the buffer layer covering the active layer, a gate electrode on the gate insulation layer, an ILD layer on the gate insulation layer covering the gate electrode, a transparent conductive layer on the ILD layer, and a metallic layer on the transparent conductive layer, wherein
the active layer comprises source/drain contact regions at two ends, each having a contact region via, and a ditch region in the center of the active layer;
insulation layer vias are configured in the ILD layer and the gate insulation layer connecting the contact region vias, buffer layer troughs are configured on the buffer layer connecting the contact region vias, undercut structure is formed between the buffer layer troughs and the active layer around the contact region vias; and
the transparent conductive layer is separated by the contact region vias, the metallic layer is continuously extended into and fills up the buffer layer troughs, the metallic layer comprises source/drain electrodes and touch line, the source/drain electrodes contact the source/drain contact regions of the active layer from below through the buffer layer troughs.

10. The TFT substrate according to claim 9, further comprising a shading layer between the substrate and the buffer layer, a passivation layer on the ILD layer covering the transparent conductive layer and the metallic layer, and a common electrode layer on the passivation layer, wherein
the transparent conductive layer is made of indium tin oxide (ITO); and
the active layer is a low temperature poly-silicon (LTPS) layer.

* * * * *